United States Patent [19]
Norimatsu et al.

[11] Patent Number: 6,049,638
[45] Date of Patent: Apr. 11, 2000

[54] PHOTODETECTOR MODULE

[75] Inventors: Masaaki Norimatsu; Naoki Yamamoto; Kazunori Miura; Kazuhiro Tanaka; Goji Nakagawa, all of Kawasaki, Japan

[73] Assignee: Fujitsu Limited, Kawasaki, Japan

[21] Appl. No.: 08/989,766

[22] Filed: Dec. 12, 1997

[30] Foreign Application Priority Data

May 22, 1997 [JP] Japan ................................ 9-131778
Aug. 22, 1997 [JP] Japan ................................ 9-225958

[51] Int. Cl.$^7$ ............................................. G02B 6/10
[52] U.S. Cl. ............................................. 385/14
[58] Field of Search ............................. 385/14, 31, 33, 385/36, 88–94

[56] References Cited

U.S. PATENT DOCUMENTS

| | | | |
|---|---|---|---|
| 5,400,419 | 3/1995 | Heinen | 385/14 |
| 5,500,910 | 3/1996 | Boudreau et al. | 385/24 |
| 5,600,741 | 2/1997 | Hauer et al. | 385/35 |
| 5,701,374 | 12/1997 | Makiuchi | 385/49 |
| 5,883,988 | 3/1999 | Yamamoto et al. | 385/14 |

FOREIGN PATENT DOCUMENTS

| | | |
|---|---|---|
| 61-133911 | 6/1986 | Japan . |
| 1-181479 | 7/1989 | Japan . |
| 3-179306 | 8/1991 | Japan . |
| 3-290606 | 12/1991 | Japan . |
| 6-29566 | 2/1994 | Japan . |
| 7-198976 | 8/1995 | Japan . |
| 8-32102 | 2/1996 | Japan . |

*Primary Examiner*—Hung N. Ngo
*Attorney, Agent, or Firm*—Staas & Halsey

[57] ABSTRACT

A photodetector module including a support substrate having a main surface, an optical waveguide mounted on the support substrate and having an end face for emerging a light beam along a first optical path, and a photodetector mounted on the support substrate so that the light beam emerged from the end face of the optical waveguide is incident on the photodetector, the photodetector having a photodetecting portion responding to the light beam incident on the photodetector. The photodetector module further includes a first inclined surface formed on a substrate of the photodetector for refracting the light beam along the first optical path to a second optical path, and a second inclined surface for totally reflecting the light beam along the second optical path to a third optical path substantially perpendicular to the photodetecting portion.

30 Claims, 13 Drawing Sheets

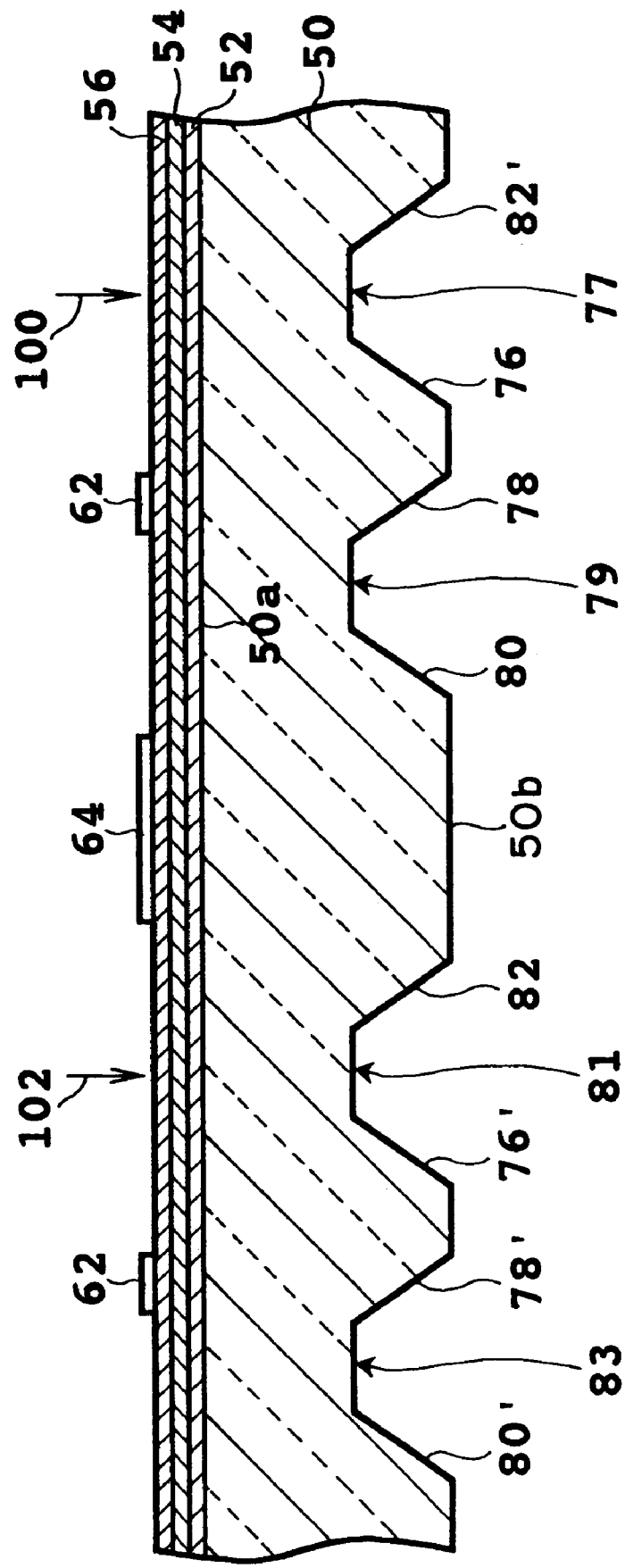

PHOTODETECTOR MODULE

BACKGROUND OF THE INVENTION

1. Field of the Invention

The present invention relates to a photodetector module for converting an input optical signal into an electrical signal and outputting the electrical signal.

2. Description of the Related Art

On the receiving side of a general optical communication system, an optical signal transmitted through an optical waveguide is opto-electrically converted into an electrical signal by a photodetector such as a photodiode, and information is reproduced according to the electrical signal obtained. The photodetector is a device indispensable to an optical communication system and an information processing system for processing massive amounts of information. To put such systems into widespread use in the general public, it is necessary to develop a technique capable of providing an optical waveguide for transmitting an optical signal and a photodetector for converting the optical signal into an electrical signal with a high efficiency at a low cost.

FIG. 1 shows a sectional view of a photodetector module 2 in the prior art. The photodetector module 2 includes a photodetector 6 mounted on a support substrate 4. The photodetector 6 is formed by sequentially laminating an n-type InP buffer layer 10, an InGaAs light absorbing layer 12, and an n$^-$InP layer 14 on a substrate 8 of n-type InP by MOCVD, for example. Two p-type regions 16 and 18 are formed in the n$^-$InP layer 14 by thermal diffusion of zinc, for example. Two p electrodes 20 and 22 are formed on the surfaces of the p-type regions 16 and 18, respectively.

The p-type region 16, the InGaAs light absorbing layer 12, and the n-type InP buffer layer 10 constitute a pin photodiode (pin-PD) 24. Similarly, the p-type region 18, the InGaAs light absorbing layer 12, and the n-type InP buffer layer 10 constitute a pin-PD 26. The n-type buffer layer 10 serves as a common n electrode. Thus, the two pin photodiodes 24 and 26 are arranged in parallel with the common n electrode on the whole of the photodetector. A bias voltage is applied between the p electrodes 20 and 22 by a bias power supply 28 to apply a reverse bias to the pin-PD 24 on which light is incident.

Inclined surfaces 34 and 36 are formed at a lower end portion of the substrate 8 on the opposite sides. An optical waveguide 38 is mounted on the support substrate 4, and a light beam 40 emerged from an end face 38a of the optical waveguide 38 is refracted by the inclined surface 34 and transmitted through the substrate 8 of the photodetector 6 to enter the pin photodiode 24. A portion of the InGaAs light absorbing layer 12 immediately below the p-type region 16 functions as a photodetecting portion 30. When light enters the photodetecting portion 30, electron-hole pairs are generated. These electrons and holes are moved by an electric field due to the above-mentioned bias voltage to bring about a flow of electric current having an intensity proportional to the intensity of the incident light through a resistor 32. The current is taken out as a voltage signal across the resistor 32.

In the conventional photodetector module 2 shown in FIG. 1, the light beam 40 is obliquely incident on the photodetecting portion 30. Accordingly, if the thickness of the substrate 8 deviates from a given thickness, the position of the light beam on the photodetecting portion 30 is largely deviated to cause a reduction in optical coupling efficiency. To prevent the reduction in optical coupling efficiency, the area of the photodetecting portion 30 must be made large.

However, the enlargement of the photodetecting portion 30 causes an increase in capacitance of the photodetector, which results in deterioration of response characteristics. Further, since the incident angle at the interface between the light absorbing layer 12 and the buffer layer 10 is large, the reflectivity at the interface differs according to polarization, causing polarization dependence of the output beam from the optical waveguide 38.

SUMMARY OF THE INVENTION

It is therefore an object of the present invention to provide a photodetector module which can couple an optical waveguide and a photodetector with a high efficiency and can improve the operating speed of the photodetector.

In accordance with an aspect of the present invention to provide a photodetector module comprising a support substrate having a main surface; an optical waveguide mounted on said support substrate, said optical waveguide having an end face for emerging a light beam along a first optical path; a photodetector mounted on said support substrate so that said light beam emerged from said end face of said optical waveguide is incident on said photodetector, said photodetector having a photodetecting portion responding to said light beam incident on said photodetector; first optical path converting means for converting said first optical path into a second optical path; and second optical path converting means for converting said second optical path into a third optical path substantially perpendicular to said photodetecting portion.

Preferably, the first and second optical path converting means comprise first and second inclined surfaces formed on a substrate of the photodetector obliquely to the main surface of the support substrate. The first inclined surface is formed at an angle to the main surface of the support substrate so that the light beam emerged from the end face of the optical waveguide is refracted from the first optical path to the second optical path, and the second inclined surface is formed at an angle to the second optical path so that the light beam refracted by the first inclined surface is reflected from the second optical path to the third optical path.

With the above configuration of the present invention, the light beam emerged from the end face of the optical waveguide is substantially perpendicularly incident on the photodetecting portion. Accordingly, even when the light beam is somewhat diffused, the deviation of light beam position due to a manufacturing error of the photodetector can be made smaller than that in the prior art, thereby allowing a reduction in area of the photodetecting portion. As a result, the capacitance of the photodetector can be suppressed to improve the response characteristics. Furthermore, since the angle of incidence of the light beam on the photodetecting portion is small, the reflectivity at the interface between the substrate of the photodetector and the photodetecting portion does not differ according to polarization, so that no polarization dependence occurs on the output beam from the optical waveguide.

In accordance with another aspect of the present invention, there is provided a manufacturing method for a photodetector module comprising the steps of laminating a plurality of layers including a light absorbing layer on a first surface of a substrate to form a laminate structure; forming a plurality of photodetector regions on said plurality of layers; forming a plurality of grooves each defined by a pair of inclined surfaces by etching a second surface of said substrate opposite to said first surface so as to isolate any adjacent ones of said photodetector regions; dividing said laminate structure at positions corresponding to alternate ones of said plurality of grooves to form a plurality of photodetectors each having said inclined surfaces at divided portions; mounting an optical waveguide on a support substrate; and mounting each of said photodetectors on said support substrate so that one of said inclined surfaces is opposed to an end face of said optical waveguide.

In accordance with a further aspect of the present invention, there is provided a photodetector module comprising a support substrate having a main surface; an optical waveguide mounted on said support substrate, said optical waveguide having an end face for emerging a light beam along a first optical path; a carrier mounted on said support substrate, said carrier having an inclined surface opposed to said end face of said optical waveguide and formed obliquely to said main surface of said support substrate, for refracting said light beam to convert said first optical path into a second optical path; and a photodetector mounted on said carrier so that said light beam propagated along said second optical path is incident on said photodetector, said photodetector having a photodetecting portion responding to said light beam incident on said photodetector.

With this configuration, the photodetector and the carrier are prepared as separate members. Accordingly, light emerged from the optical waveguide can be made incident on the photodetector with a high efficiency by using a conventional structure for the photodetector.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 4 is a sectional view illustrating a manufacturing process for the photodetector according to the first preferred embodiment;

DETAILED DESCRIPTION OF THE PREFERRED EMBODIMENTS

Figure 2:
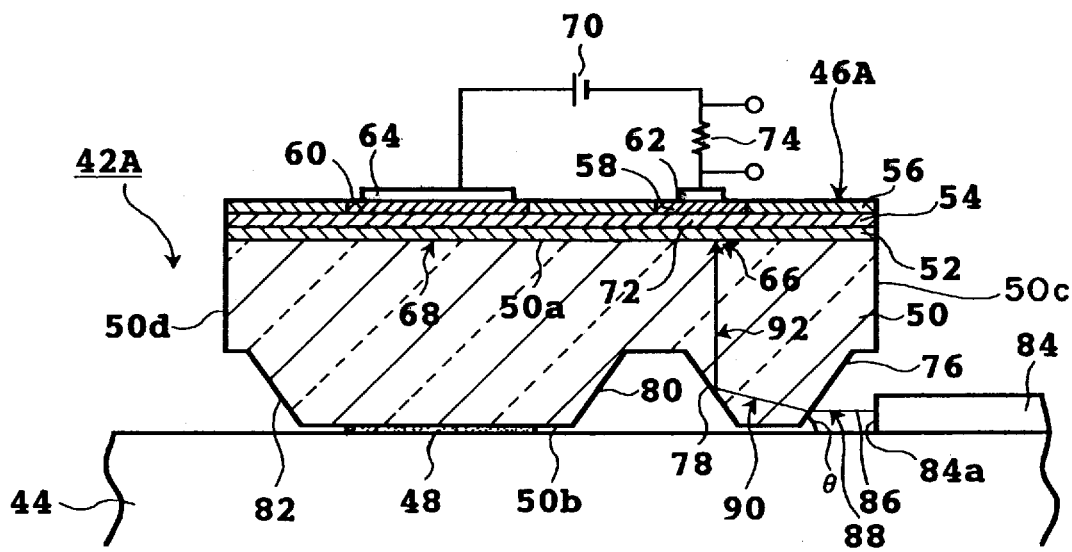
FIG. 2 is a sectional view of a first preferred embodiment of the present invention.

Various preferred embodiments of the present invention will now be described with reference to the drawings. In the following description of the preferred embodiments, substantially the same parts will be denoted by the same reference numerals. Referring to FIG. 2, there is shown a sectional view of a photodetector module 42A according to a first preferred embodiment of the present invention. The photodetector module 42A includes a photodetector 46A mounted on a support substrate 44 of Si.

The photodetector 46A is fixed to the support substrate 44 by a connection layer 48. The connection layer 48 is formed of thermoplastic adhesive or solder. Preferably, solder is laminated after laminating titanium, platinum, gold, etc. on the support substrate 44, so as to improve adhesion of the solder to the support substrate 44. The photodetector 46A is formed by sequentially laminating an n-type InP buffer layer 52, an InGaAs light absorbing layer 54, and an n$^-$InP layer 56 on an n-type InP substrate 50.

The substrate 50 has first and second main surfaces 50a and 50b and first and second end surfaces 50c and 50d. Two p-type regions 58 and 60 are formed in the n$^-$InP layer 56 by thermal diffusion of zinc, for example. Two p electrodes 62 and 64 are formed on the surfaces of the p-type regions 58 and 60, respectively. A pin photodiode 66 is formed by the p-type region 58, the InGaAs light absorbing layer 54, and the InP buffer layer 52. Similarly, a pin photodiode 68 is formed by the p-type region 60, the InGaAs light absorbing layer 54, and the InP buffer layer 52.

The pin photodiodes 66 and 68 are arranged in parallel with a common n electrode on the whole of the photodetector 46A. The pin photodiode 68 supplies a drive current to the pin photodiode 66. A bias voltage is applied between the p electrodes 62 and 64 by a bias power supply 70 so that the pin photodiode 66 on which light is incident is reverse-biased.

The second main surface 50b of the substrate 50 is formed with inclined surfaces 76, 78, 80, and 82. These inclined surfaces 76, 78, 80, and 82 are formed by wet etching. For example, the inclined surfaces 76, 78, 80, and 82 may be formed by etching the second main surface 50b having a crystal orientation (100) with a mixture liquid of bromine, hydrobromic acid, and water to thereby make a crystal face (111) of InP appear and obtain an angle $\theta$ of 54.7° for each of the inclined surfaces 76, 78, 80, and 82. An optical waveguide 84 having an end face 84a for light emergence is mounted on the support substrate 44 in such a manner that the end face 84a is opposed to the inclined surface 76 of the photodetector 46A. The optical waveguide 84 is formed monolithically with the support substrate 44. Alternatively, the optical waveguide 84 may be formed separately from the support substrate 44 and fixed thereto by adhesive or the like. A typical example of the optical waveguide 84 is an SiO$_2$ optical waveguide formed on an Si substrate. As another example, the optical waveguide 84 may be formed from an optical fiber. In the latter case, a groove is formed on the surface of the support substrate 44, and the optical fiber is partially inserted in this groove to be fixed to the support substrate 44 by adhesive or the like. An antireflection film is formed on the inclined surface 76.

A light beam 86 emerged from the end face 84a of the optical waveguide 84 is refracted by the inclined surface 76, so that a first optical path 88 of the light beam 86 parallel to the surface of the support substrate 44 is converted into a second optical path 90. The light beam refracted by the inclined surface 76 is totally reflected by the inclined surface 78, so that the second optical path 90 is converted into a third optical path 92 and the light beam is substantially perpendicularly incident on a photodetecting portion 72 of the pin photodiode 66. The photodetecting portion 72 is defined as a portion of the InGaAs light absorbing layer 54 immediately below the p region 58.

When the light beam is incident on the photodetecting portion 72, electron-hole pairs are generated and these electrons and holes are moved by a bias electric field to bring about a flow of electric current having an intensity proportional to the intensity of the incident light through a resistor 74. Accordingly, the intensity of the light incident on the photodetecting portion 72 can be taken out as a potential difference across the resistor 74. In the case that the angle of each of the inclined surfaces 76 and 78 is equal to 54.7° which is an angle inherent to the crystal face (111), the light beam impinges on the photodetecting portion 72 at an incident angle of about 5.5°. Accordingly, although the thickness of the substrate 50 somewhat varies, the incident position of the light beam remains unchanged.

Figure 3:
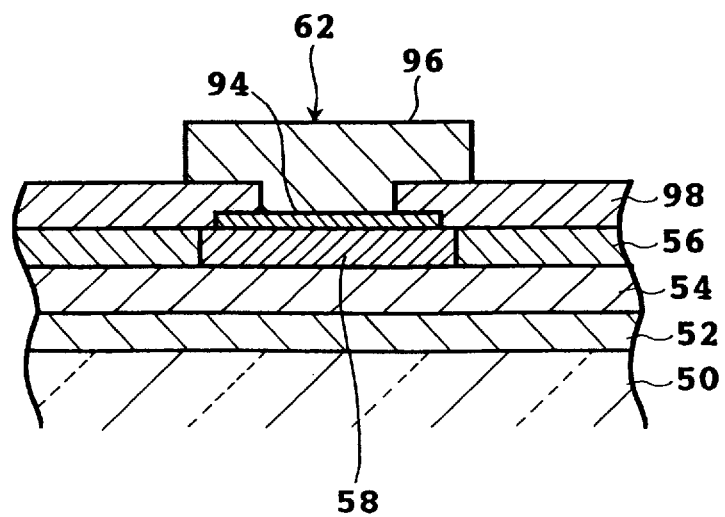
FIG. 3 is an enlarged sectional view of a photodetecting portion of the photodetector according to the first preferred embodiment.

FIG. 3 shows an enlarged sectional view of a photodetecting portion of the photodetector 46A. A manufacturing method for the photodetector 46A will now be described with reference to FIGS. 3 and 4. The n-type InP buffer layer 52, the undoped InGaAs light absorbing layer 54, and the n$^-$InP layer 56 are sequentially laminated on the n-type InP substrate 50 by MOCVD, for example. Then, the p-type regions 58 and 60 are formed in the n$^-$InP layer 56 by thermal diffusion of zinc, for example.

Then, gold and zinc are laminated on the surface of the p-type region 58 to form an ohmic contact 94. Similarly, an ohmic contact (not shown) is formed also on the p-type region 60. An SiN protective layer 98 for protecting the n$^-$InP layer 56 is next formed. A metal layer 96 is next formed on the ohmic contact 94 by a well known lift-off process. The ohmic contact 94 and the metal layer 96 constitute the p electrode 62.

Then, the second main surface 50b of the substrate 50 is polished to obtain a given thickness of the substrate 50, and next subjected to wet etching with a mixture liquid of bromine, hydrobromic acid, and water to form grooves 77, 79, 81, and 83 as shown in FIG. 4. By the wet etching, a crystal face (111) of InP appears and the angle θ of each inclined surface of the grooves 77, 79, 81, and 83 becomes 54.7°. An antireflection coating is next formed on each of the inclined surfaces 76 and 76'. The substrate 50 is next cleaved at positions shown by arrows 100 and 102 in FIG. 4 so that the inclined surface 76 for refracting light and the inclined surface 78 for reflecting the light are included in one photodetector, thus manufacturing the photodetector 46A.

Figure 1:
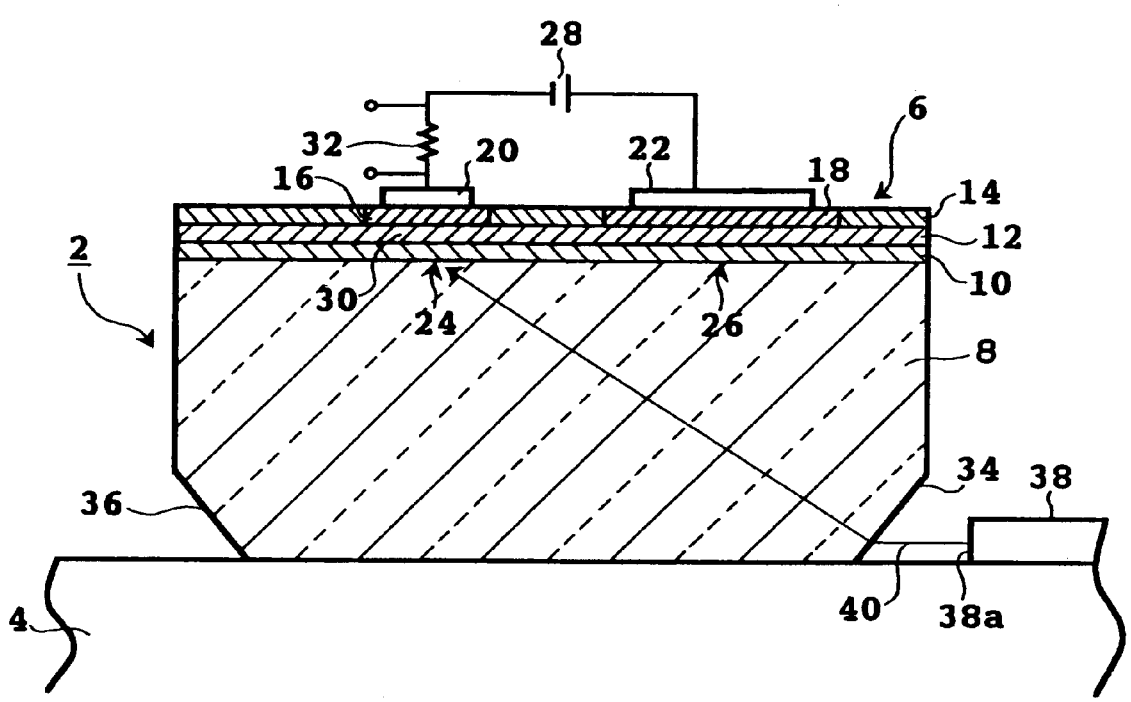
FIG. 1 is a sectional view of a photodetector module in the prior art.
Figure 5A:
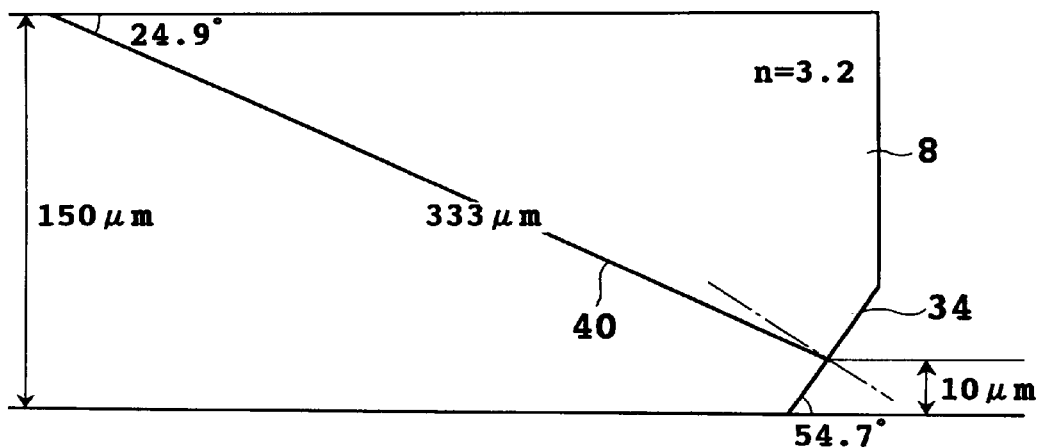
FIGS. 5A and 5B are views showing the prior art and the present invention, respectively, for illustrating improved effects of the present invention over the prior art.
Figure 5B:
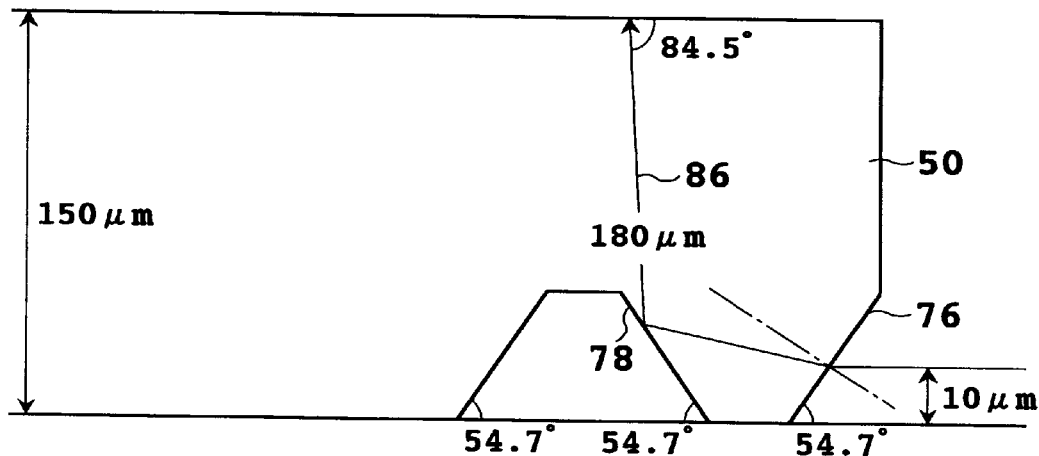

Improved effects of the present invention over the prior art shown in FIG. 1 will now be described with reference to FIGS. 5A and 5B. First, the quantity of light transmitted through the substrate will be examined. It is assumed that each of the substrates 8 and 50 has a refractive index n of 3.2 and has a thickness of 150 μm. In the case that light is incident on the inclined surfaces 34 and 76 of the substrates 8 and 50 at a height of 10 μm from the bottom surfaces of the substrates 8 and 50, the transmission distances of the light in the substrates 8 and 50 become 333 μm in the prior art shown in FIG. 5A and 180 μm in the present invention shown in FIG. 5B.

The light transmission quantity in an InP substrate having a carrier concentration of $5\times10^{18}/cm^3$ is $\exp(-5\times 10^{-4}\times d)$ where d (μm) represents the light transmission distance in the substrate. Accordingly, in the prior art of FIG. 5A, the light transmission quantity becomes $\exp(-5\times10^{-4}\times 333)=0.85$, whereas in the present invention of FIG. 5B, the light transmission quantity becomes $\exp(-5\times10^{-4}\times 180)=0.91$. Therefore, the light transmission quantity in the present invention is improved by 0.3 dB over that in the prior art.

Secondly, the reflection at the interface between the InP buffer layer and the InGaAs light absorbing layer will be examined. In the prior art shown in FIG. 1, the reflection of an S wave at the interface between the InP buffer layer 10 and the InGaAs light absorbing layer 12 is 9%. In the first preferred embodiment of the present invention shown in FIG. 2, the reflection of an S wave at the interface between the InP buffer layer 52 and the InGaAs light absorbing layer 54 is 1%. Therefore, the reflection characteristics of the present invention is improved by 0.3 dB over those of the prior art. Summing the improvements in the light transmission quantity and the reflection characteristics in the present invention results in an improvement of 0.6 dB over the prior art.

Finally, the area of the photodetecting portion will be examined. The area of the photodetecting portion required to receive light from a light source having a divergent angle of 8° spaced a distance of 40 μm from the photodetector becomes 150×60 μm$^2$ in the prior art of FIG. 1 and 60×50 μm$^2$ in the present invention. Therefore, the area of the photodetecting portion in the present invention can be reduced to ⅓ of that in the prior art. Since the capacitance of the photodetector is substantially dependent on the area of the photodetecting portion, the capacitance of the photodetector in the present invention becomes ½ of that in the prior art.

A cut-off frequency f is expressed as:

$$f=1/(2\pi CR)$$

where C is the capacitance and R is the load resistance. Accordingly, the cut-off frequency f in the present invention becomes two times that in the prior art. For example, when R=50Ω and C=0.5 picofarad at −2V, the cut-off frequency in the present invention becomes $f=1/(2\pi\times50\times0.5\times10^{-12})=6.4\times10^9$ (Hz).

Figure 6:
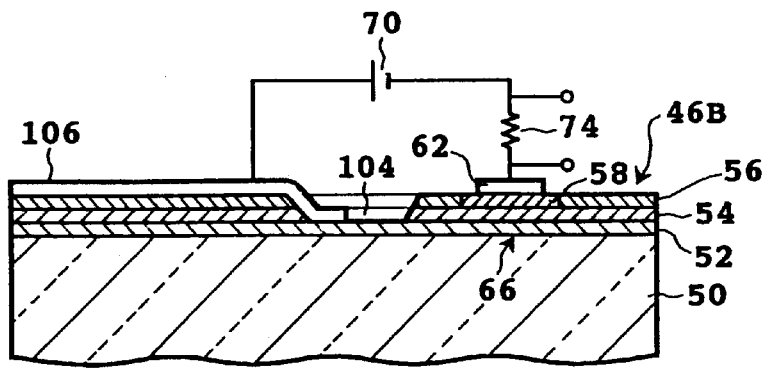
FIG. 6 is a sectional view of a second preferred embodiment of the present invention.

FIG. 6 shows a sectional view of a photodetector 46B according to a second preferred embodiment of the present invention. In this preferred embodiment, an n$^-$InP layer 56 and an InGaAs light absorbing layer 54 are partially removed by wet etching, for example, to partially expose the surface of an InP buffer layer 52, thereby forming a recess 104. An n electrode 106 is formed on the n$^-$InP layer 56 in such a manner that an extended portion of the n electrode 106 is in contact with the InP buffer layer 52. A bias voltage is applied between the p electrode 62 and the n electrode 106 by a power supply 70 so that the p electrode 62 is reverse-biased. The other configuration of this preferred embodiment is similar to that of the first preferred embodiment shown in FIG. 2.

Figure 7:
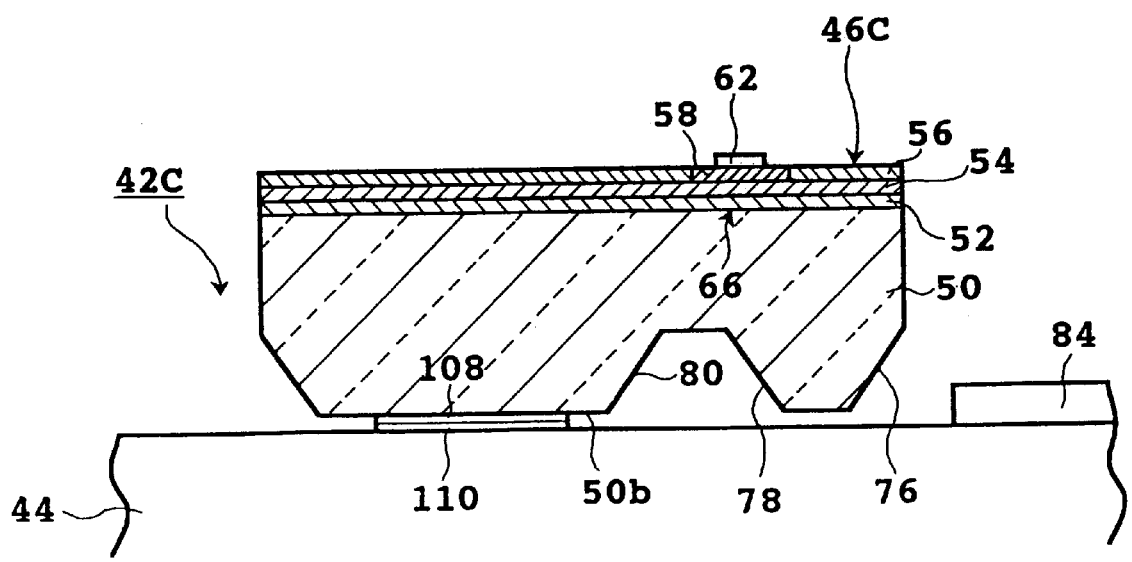
FIG. 7 is a sectional view of a third preferred embodiment of the present invention.

FIG. 7 shows a sectional view of a photodetector module 42C according to a third preferred embodiment of the present invention. In this preferred embodiment, an n electrode 108 is formed on a second main surface 50b of a substrate 50 of a photodetector 46C. The n electrode 108 is joined to a metal layer 110 formed on a support substrate 44. A bias voltage is applied between the p electrode 62 and the n electrode 108 by a bias power supply (not shown) so that a pin photodiode 66 formed below the p electrode 62 is reverse-biased.

Figure 8:
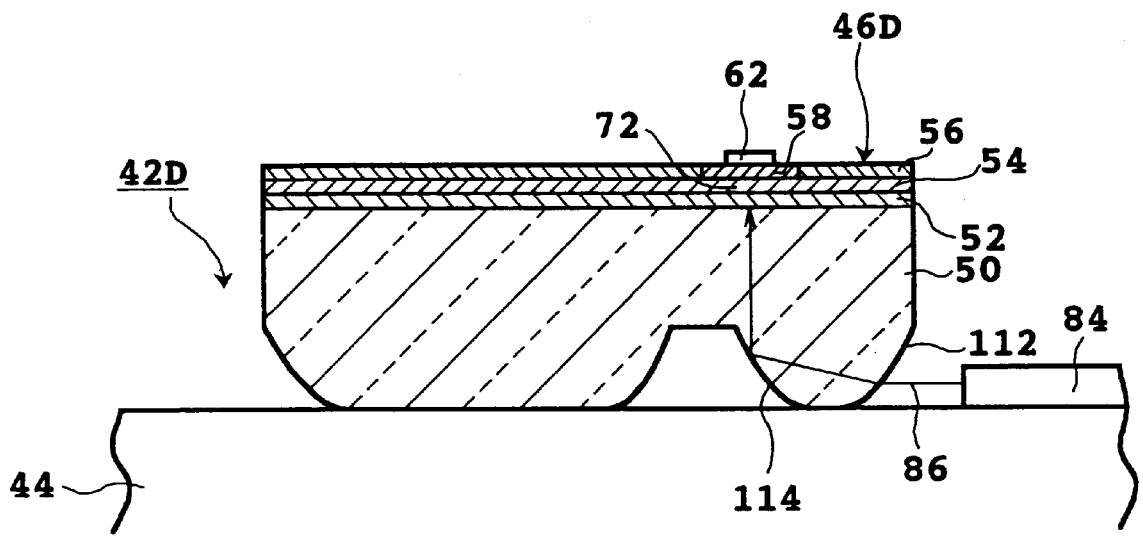
FIG. 8 is a sectional view of a fourth preferred embodiment of the present invention.

FIG. 8 shows a sectional view of a photodetector module 42D according to a fourth preferred embodiment of the present invention. In this preferred embodiment, a curved surface 112 for refracting a light beam 86 and a curved surface 114 for totally reflecting the light beam refracted are formed by ion beam etching. Thus, both the refraction surface and the total reflection surface are formed as the curved surfaces 112 and 114 to make the light beam enter a photodetecting portion 72 formed immediately below the p electrode 62.

Figure 9:
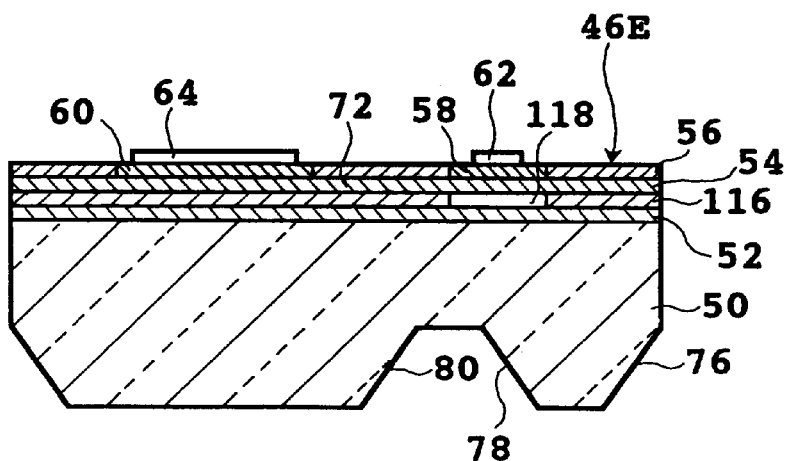
FIG. 9 is a sectional view of a fifth preferred embodiment of the present invention.

FIG. 9 shows a sectional view of a photodetector 46E according to a fifth preferred embodiment of the present invention. In this preferred embodiment, a reflection film 116 for blocking light entering any portions other than a photodetecting portion 72 is formed below the photodetecting portion 72, so as to prevent entrance of light from any optical waveguides other than an optical waveguide 84. The reflection film 116 is formed between a buffer layer 52 and a light absorbing layer 54, and has an opening 118 opposed to the photodetecting portion 72.

Figure 10:
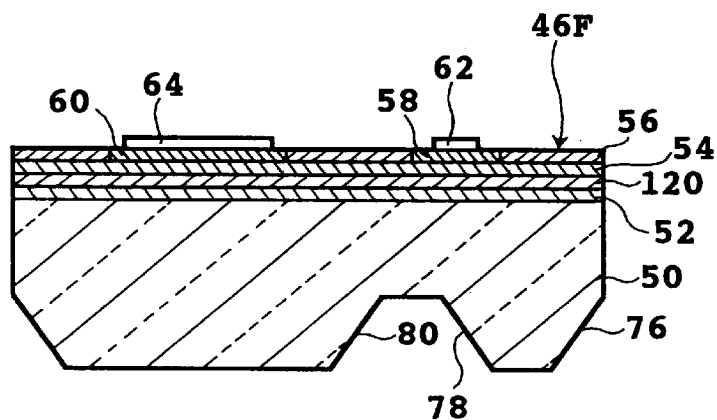
FIG. 10 is a sectional view of a sixth preferred embodiment of the present invention.

FIG. 10 shows a sectional view of a photodetector 46F according to a sixth preferred embodiment of the present invention. In this preferred embodiment, a semiconductor multilayer film 120 having a wavelength separating function or a polarization separating function is sandwiched between a buffer layer 52 and a light absorbing layer 54. The semiconductor multilayer film 120 may be formed by alternately laminating InP layers and InGaAs layers.

Figure 11:
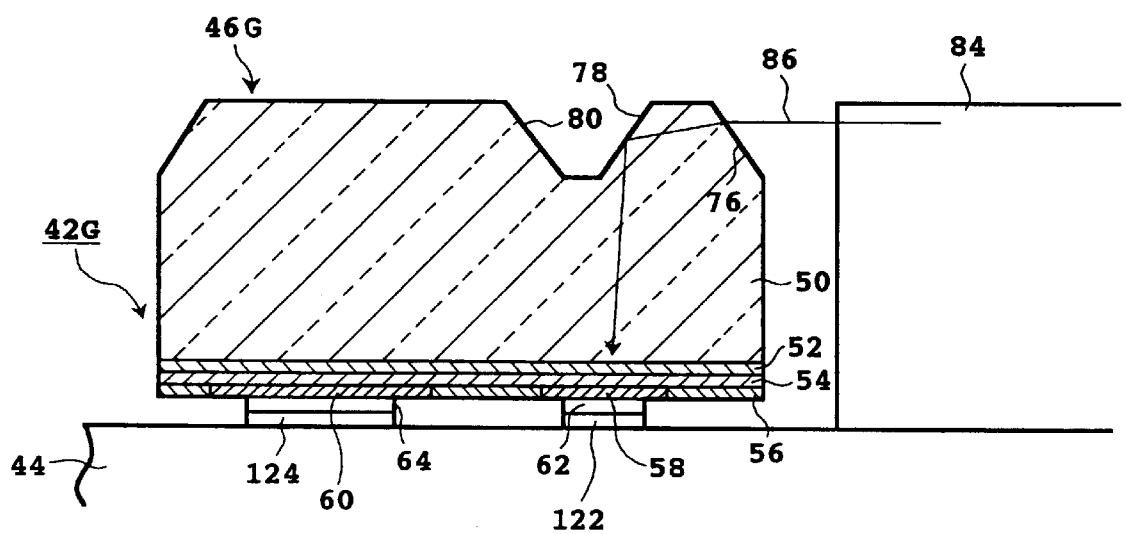
FIG. 11 is a sectional view of a seventh preferred embodiment of the present invention.

FIG. 11 shows a sectional view of a photodetector module 42G according to a seventh preferred embodiment of the present invention. In this preferred embodiment, metal bumps 122 and 124 as bump electrodes are formed on a support substrate 44 at positions corresponding to p electrodes 62 and 64, respectively. The metal bumps 122 and 124 are fixed to the support substrate 44 by flip chip bonding. The metal bumps 122 and 124 are connected to a wiring pattern formed on the support substrate 44. Accordingly, the p electrodes 62 and 64 are connected through the metal bumps 122 and 124 to the wiring pattern on the support substrate 44.

Figure 12:
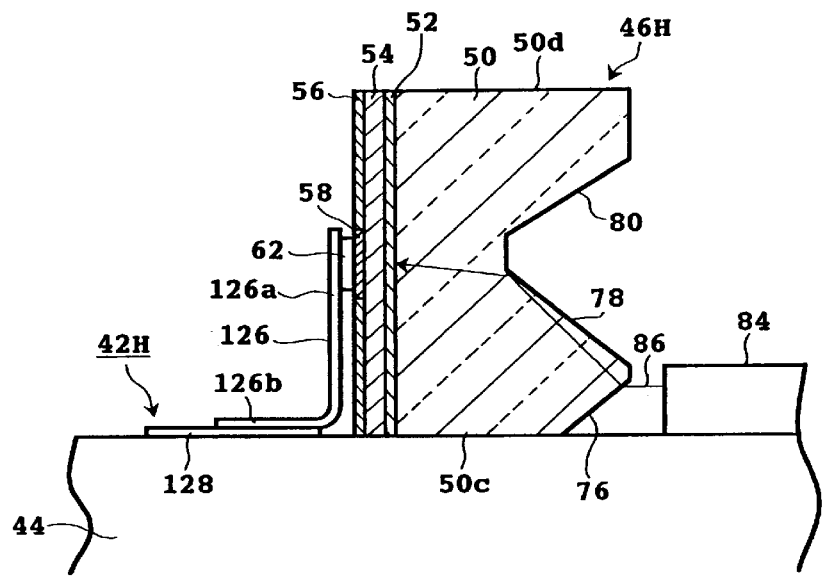
FIG. 12 is a sectional view of an eighth preferred embodiment of the present invention.

FIG. 12 shows a sectional view of a photodetector module 42H according to an eighth preferred embodiment of the present invention. In this preferred embodiment, a first end surface 50c of a photodetector 46H is joined to a support substrate 44. An L-shaped lead electrode 126 having a first portion 126a and a second portion 126b substantially perpendicular to the first portion 126a is provided in such a manner that the first portion 126a is connected to a p electrode 62 and the second portion 126b is connected to a wiring pattern 128 formed on the support substrate 44. The first portion 126a of the lead electrode 126 is spaced a given distance from the front surface of the photodetector 46H (the first main surface 50a of the substrate 50), and extends substantially parallel to the front surface of the photodetector 46H.

Figure 13:
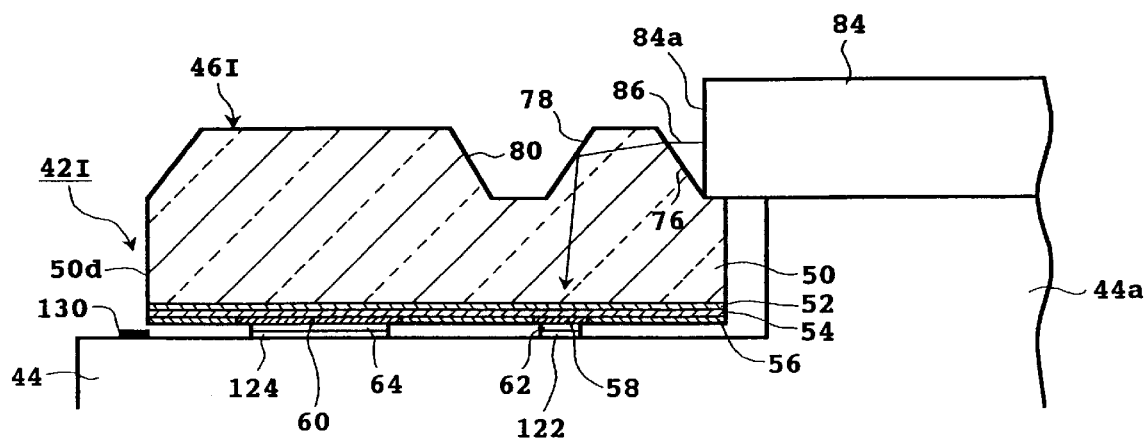
FIG. 13 is a sectional view of a ninth preferred embodiment of the present invention.

FIG. 13 shows a sectional view of a photodetector module 42I according to a ninth preferred embodiment of the present invention. In this preferred embodiment, a support substrate 44 has a raised portion 44a having a given height, and a positioning marker 130 is formed on the support substrate 44. In mounting a photodetector 46I on the support substrate 44 by flip chip bonding, a second end surface 50d of a substrate 50 is positioned at this marker 130, thereby achieving accurate positioning of the photodetector 46I. An optical waveguide 84 is mounted on the raised portion 44a of the support substrate 44 and fixed thereto at such a position that an end face 84a of the optical waveguide 84 abuts against an inclined surface 76 of the photodetector 46I.

Figure 14:
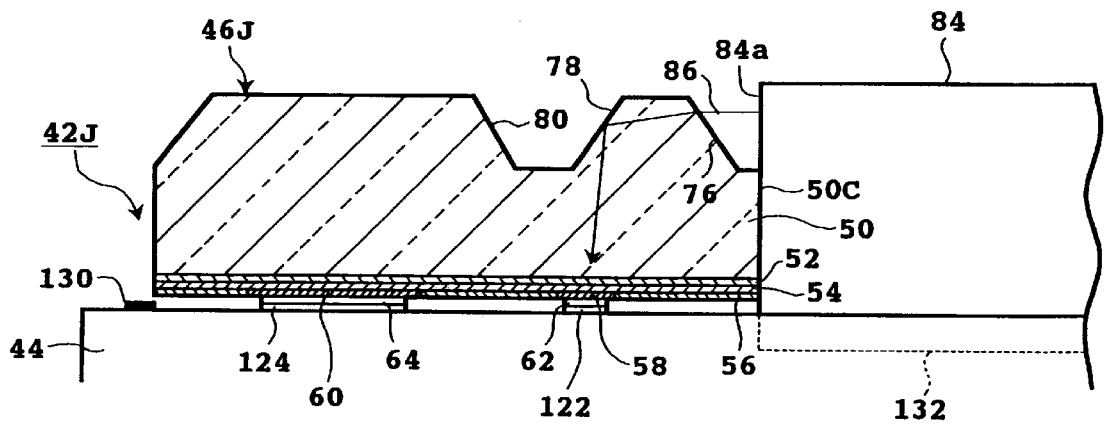
FIG. 14 is a sectional view of a tenth preferred embodiment of the present invention.

FIG. 14 shows a sectional view of a photodetector module 42J according to a tenth preferred embodiment of the present invention. Also in this preferred embodiment, a marker 130 is used to position a photodetector 46J. A V-shaped groove 132 extending in the longitudinal direction of an optical waveguide 84 is formed on a support substrate 44. A lower end portion of the optical waveguide 84 has a shape corresponding to the shape of the V-shaped groove 132. The optical waveguide 84 is fixed to the support substrate 44 at such a position that the optical waveguide 84 is slid in the V-shaped groove 132 to make an end face 84a of the optical waveguide 84 abut against a first end surface 50c of the photodetector 46J.

Figure 15:
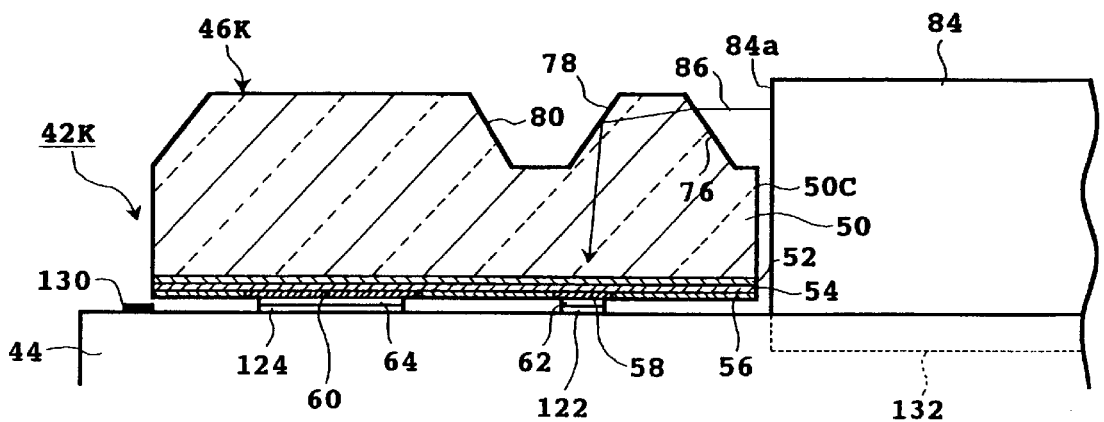
FIG. 15 is a sectional view of an eleventh preferred embodiment of the present invention.

FIG. 15 shows a sectional view of a photodetector module 42K according to an eleventh preferred embodiment of the present invention. This preferred embodiment is similar to the tenth preferred embodiment shown in FIG. 14, but different from the tenth preferred embodiment in the point that an optical waveguide 84 is fixed to a support substrate 44 in the condition where an end face 84a of the optical waveguide 84 is spaced from a first end surface 50c of a photodetector 46K.

Figure 16:
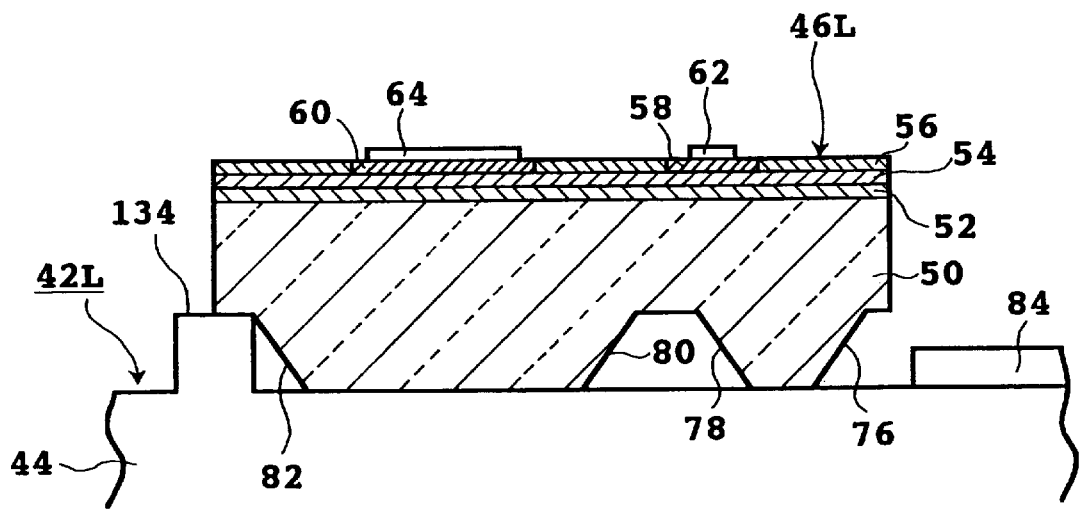
FIG. 16 is a sectional view of a twelfth preferred embodiment of the present invention.

FIG. 16 shows a sectional view of a photodetector module 42L according to a twelfth preferred embodiment of the present invention. In this preferred embodiment, a support substrate 44 has a positioning projection 134. An inclined surface 82 of a photodetector 46L abuts against the projection 134 to thereby position the photodetector 46L to the support substrate 44.

Figure 17:
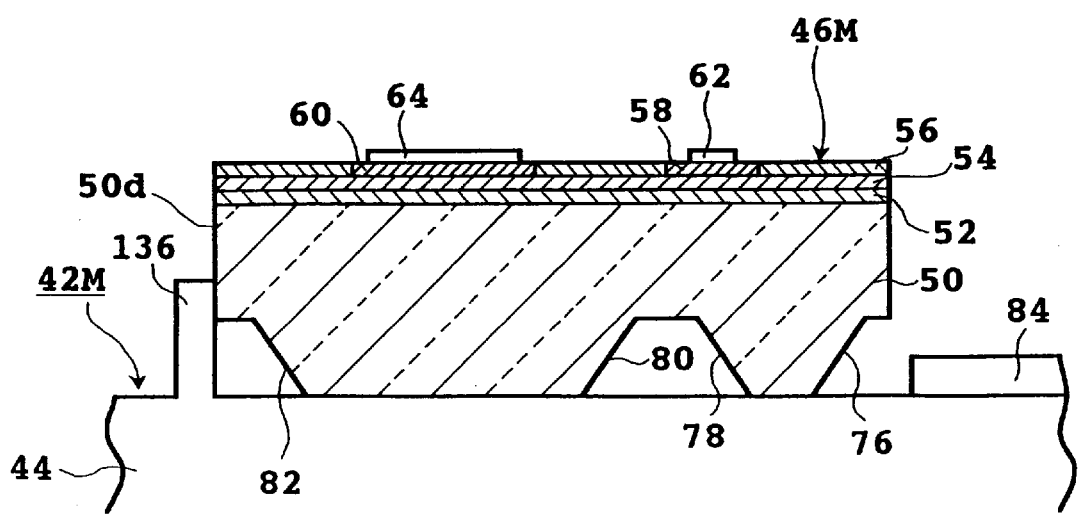
FIG. 17 is a sectional view of a thirteenth preferred embodiment of the present invention.

FIG. 17 shows a sectional view of a photodetector module 42M according to a thirteenth preferred embodiment of the present invention. Also in this preferred embodiment, a support substrate 44 has a positioning projection 136. A second end surface 50d of a photodetector 46M abuts against the projection 136 to thereby position the photodetector 46M to the support substrate 44.

Figure 18:
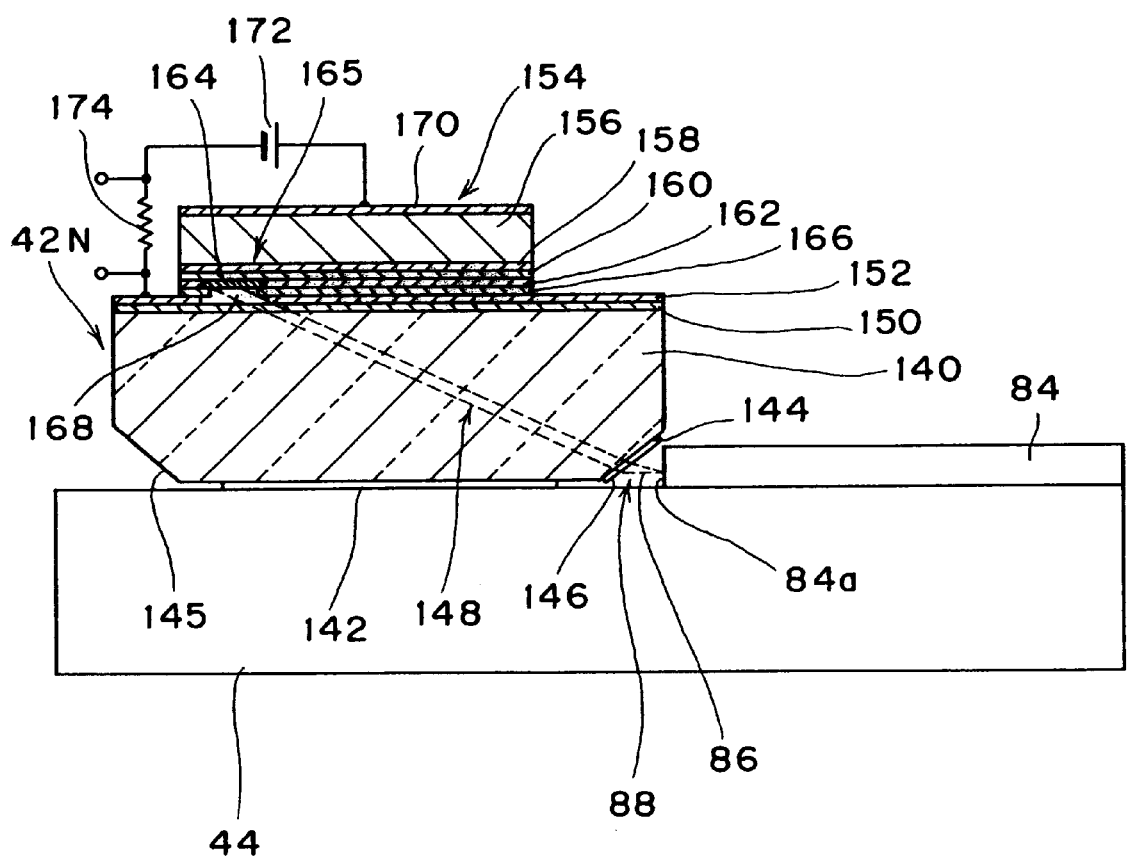
FIG. 18 is a sectional view of a fourteenth preferred embodiment of the present invention.

FIG. 18 shows a sectional view of a photodetector module 42N according to a fourteenth preferred embodiment of the present invention. In this preferred embodiment, a carrier 140 of Si is mounted on a support substrate 44 of Si, and a photodetector 154 having a conventional structure is mounted on the carrier 140. The carrier 140 is fixed to the support substrate 44 by a connection layer 142. The connection layer 142 is formed of thermoplastic adhesive or solder. Preferably, solder is laminated after laminating titanium, platinum, gold, etc. on the support substrate 44, so as to improve adhesion of the solder to the support substrate 44.

The carrier 140 has inclined surfaces 144 and 145. The inclined surfaces 144 and 145 are formed by wet etching. For example, the inclined surfaces 144 and 145 are formed by etching the surface of the carrier 140 having a crystal orientation (100) with an anisotropic etching liquid such as a KOH aqueous solution to thereby make a crystal face (111)

of Si appear and obtain an angle θ of 54.7° for each of the inclined surfaces 144 and 145. An antireflection film 146 is formed on the inclined surface 144. The antireflection film 146 is formed from a silicon nitride film having a thickness of ¼ of the wavelength λ of incident light, for example.

An optical waveguide 84 having an end face 84a for light emergence is mounted on the support substrate 44 in such a manner that the end face 84a is opposed to the inclined surface 144 of the carrier 140. The optical waveguide 84 is formed monolithically with the support substrate 44. Alternatively, the optical waveguide 84 may be formed separately from the support substrate 44 and fixed thereto by adhesive or the like. An antireflection film 150 of silicon nitride is formed on the upper surface of the carrier 140, and an electrode 152 of the photodetector 154 is formed on the antireflection film 150. At the same time of formation of the electrode 152, a pattern as a positioning marker for the photodetector 154 is formed on the carrier 140.

The photodetector 154 is formed by sequentially laminating an n-type InP buffer layer 158, an InGaAs light absorbing layer 160, and an n⁻InP layer 162 on an n-type InP substrate 156 by MOCVD, for example. A p-type region 164 is formed in the n⁻InP layer 162 by thermal diffusion of zinc, for example. A p electrode 166 is formed on the n⁻InP layer 162. The p-type region 164, the InGaAs light absorbing layer 160, and the InP buffer layer 158 constitute a pin photodiode 165. The electrodes 152 and 166 opposed to the pin photodiode 165 have a recess 168. An n electrode 170 is formed on the back surface of the n-type InP substrate 156.

The photodetector 154 is mounted on the carrier 140 by flip chip bonding. That is, the photodetector 154 is positioned by placing the p electrode 166 on the upper surface of the carrier 140 and aligning the marker on the photodetector 154 to the marker on the carrier 140. Then, the photodetector 154 is fixed to the carrier 140 by using a solder bump. A bias voltage is applied between the electrode 152 of the carrier 140 and the n electrode 170 of the photodetector 154 by a bias power supply 172 so that the pin photodiode 165 is reverse-biased.

A light beam 86 emerged from the end face 84a of the optical waveguide 84 is refracted by an inclined surface of the carrier 140, so that a first optical path 88 of the light beam 86 parallel to the surface of the support substrate 44 is converted into a second optical path 148. The light beam refracted enters a photodetecting portion of the pin photodiode 165. The photodetecting portion is defined as a portion of the InGaAs light absorbing layer 160 immediately above the p region 164. When the light beam is incident on the photodetecting portion, electron-hole pairs are generated and these electrons and holes are moved by a bias electric field to bring about a flow of electric current having an intensity proportional to the intensity of the incident light through a resistor 174. Accordingly, the intensity of the light incident on the photodetecting portion of the pin photodiode 165 can be taken out as a potential difference across the resistor 174.

Figure 19:
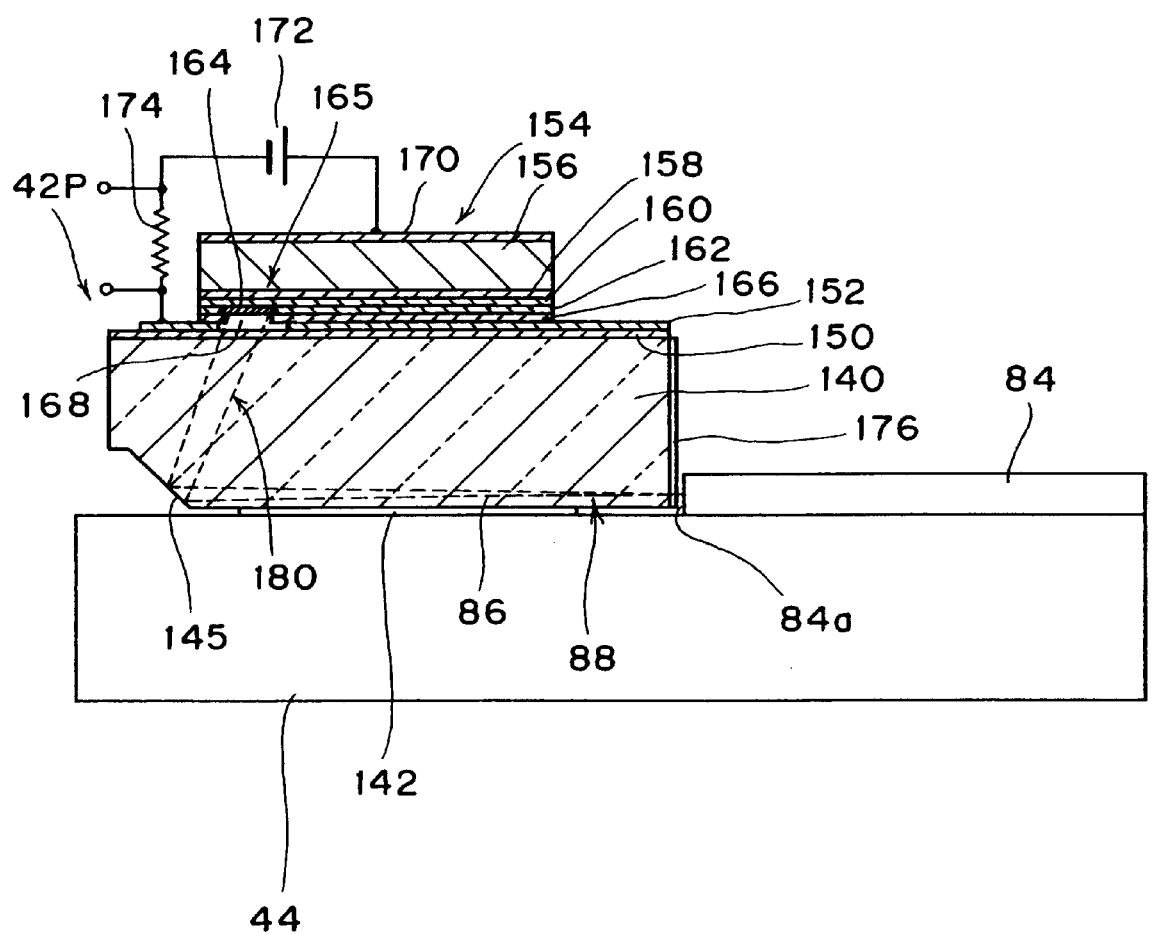
FIG. 19 is a sectional view of a fifteenth preferred embodiment of the present invention.

FIG. 19 shows a sectional view of a photodetector module 42P according to a fifteenth preferred embodiment of the present invention. This preferred embodiment is similar to the fourteenth preferred embodiment shown in FIG. 18, but different therefrom in the point that a light beam 86 is introduced to a photodetector 154 by utilizing reflection at an inclined surface 145 of a carrier 140. That is, an antireflection film 176 is formed on the surface of the carrier 140 opposed to an end face 84a of an optical waveguide 84, and the inclined surface 145 of the carrier 140 is used as a reflection surface for the light beam. The other configuration of this preferred embodiment is similar to that of the fourteenth preferred embodiment shown in FIG. 18.

The light beam 86 emerged from the end face 84a of the optical waveguide 84 is transmitted through the antireflection film 176 and introduced into the carrier 140. Then, the light beam 86 is reflected by the inclined surface 145, so that a first optical path 88 of the light beam 86 parallel to the surface of the support substrate 44 is converted into a second optical path 180. Then, the light beam reflected is incident on a photodetecting portion of a pin photodiode 165.

Figure 20:
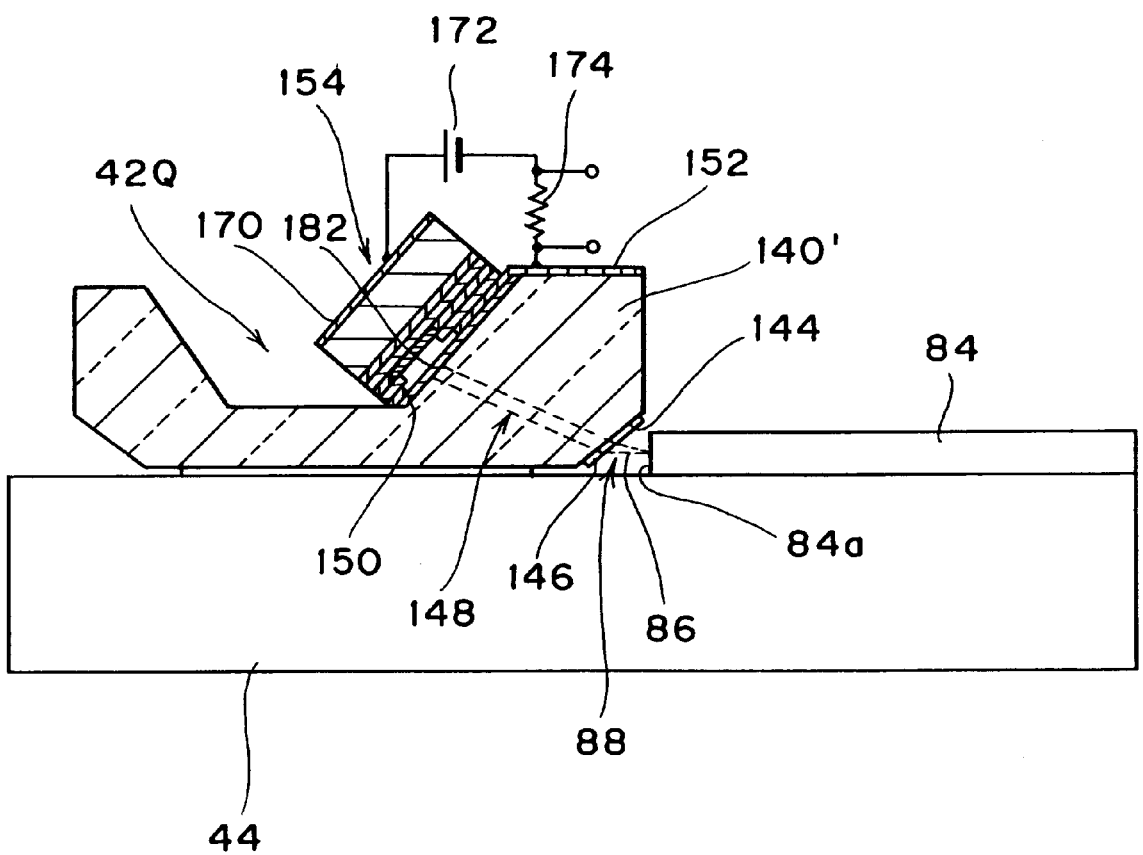
FIG. 20 is a sectional view of a sixteenth preferred embodiment of the present invention.

FIG. 20 shows a sectional view of a photodetector module 42Q according to a sixteenth preferred embodiment of the present invention. In this preferred embodiment, a carrier 140' of Si has an inclined surface 144 and an inclined surface 182 opposite to the inclined surface 144, and a photodetector 154 is mounted on the inclined surface 182. An antireflection film 150 of silicon nitride is formed on the inclined surface 182 of the carrier 140', and an electrode 152 is formed on the antireflection film 150. The photodetector 154 has substantially the same structure as that of the photodetector 154 of the fourteenth or fifteenth preferred embodiment shown in FIG. 18 or 19.

Since the photodetector 154 is mounted on the inclined surface 182 of the carrier 140' in this preferred embodiment, an optical path 148 in the carrier 140' can be made shorter than that in the carrier 140 of the fourteenth preferred embodiment shown in FIG. 18, thereby allowing suppression of spreading of a light beam incident on a photodetecting portion of the photodetector 154. Furthermore, the short optical path allows a reduction in light absorption in the carrier 140', thereby improving a light transmission quantity. In each of the fourteenth to sixteenth preferred embodiments shown in FIGS. 18 to 20, the photodetector is mounted on the carrier, so that the photodetector module for detecting light from the optical waveguide can be configured at a low cost by utilizing the photodetector having the conventional structure.

As described above, according to the present invention, the emerged light beam from the optical waveguide is refracted by the first inclined surface of the substrate of the photodetector, and next totally reflected by the second inclined surface of the substrate to substantially perpendicularly enter the photodetecting portion. Accordingly, the deviation of light beam position due to a manufacturing error of the photodetector can be reduced, so that the area of the photodetecting portion can be reduced. As a result, the capacitance of the photodetector is reduced to thereby improve the operating speed of the photodetector.

What is claimed is:

1. A photodetector module comprising:

a support substrate having a main surface;

an optical waveguide mounted on said support substrate, said optical waveguide having an end face for emerging a light beam along a first optical path;

a photodetector mounted on said support substrate so that said light beam emerged from said end face of said optical waveguide is incident on said photodetector, said photodetector having a photodetecting portion responding to said light beam incident on said photodetector;

a first optical path converter converting said first optical path into a second optical path; and a second optical path converter converting said second optical path into a third optical path substantially perpendicular to said photodetecting portion, wherein said optical waveguide is formed on said support substrate so that said first optical path is parallel to said main surface of said support substrate, and said first and second optical path converters comprise first and second inclined surfaces formed on said photodetector obliquely to said main surface of said support substrate, respectively, and said first inclined surface is formed at an angle to said main surface of said support substrate so that said light beam emerged from said end face of said optical waveguide is refracted from said first optical path to said second optical path, and said second inclined surface is formed at an angle to said second optical path so that said light beam refracted by said first inclined surface is reflected from said second optical path to said third optical path.

2. A photodetector module according to claim 1, wherein said optical waveguide is formed monolithically with said support substrate.

3. A photodetector module according to claim 1, wherein said support substrate has a groove extending in a longitudinal direction of said optical waveguide, and said optical waveguide comprises an optical fiber inserted and held in said groove of said support substrate.

4. A photodetector module comprising:

a support substrate having a main surface:

an optical waveguide mounted on said support substrate, said optical waveguide having an end face for emerging a light beam along a first optical path;

a photodetector mounted on said support substrate so that said light beam emerged from said end face of said optical waveguide is incident on said photodetector, said photodetector having a photodetecting portion responding to said light beam incident on said photodetector;

a first optical path converter converting said first optical path into a second optical path; and a second optical path converter converting said second optical path into a third optical path substantially perpendicular to said photodetecting portion, wherein said optical waveguide is formed on said support substrate so that said first optical path is parallel to said main surface of said support substrate, and said first and second optical path converters comprise first and second curved surfaces formed on said photodetector for converging said light beam to said photodetecting portion.

5. A photodetector module comprising:

a support substrate having a main surface;

an optical waveguide mounted on said support substrate, said optical waveguide having an end face for emerging a light beam along a first optical path;

a photodetector mounted on said support substrate so that said light beam emerged from said end face of said optical waveguide is incident on said photodetector, said photodetector having a photodetecting portion responding to said light beam incident on said photodetector;

a first optical path converter converting said first optical path into a second optical path; and a second optical path converter converting said second optical path into a third optical path substantially perpendicular to said photodetecting portion, wherein said optical waveguide is formed on said support substrate so that said first optical path is parallel to said main surface of said support substrate, and said first and second optical path converters comprise first and second inclined surfaces formed on said photodetector obliquely to said main surface of said support substrate, respectively, said photodetector comprises an element substrate having first and second main surfaces opposed to each other and first and second end surfaces opposed to each other, and a light absorbing layer formed on said first main surface of said element substrate and including said photodetecting portion, and said photodetector is provided on said main surface of said support substrate so that said second main surface of said element substrate is joined to said main surface of said support substrate and that said first end surface of said element substrate is opposed to said end face of said optical waveguide.

6. A photodetector module according to claim 5, wherein said photodetecting portion comprises a photodiode, and said photodetector further comprises a first electrode provided on said light absorbing layer so as to correspond to said photodetecting portion and a second electrode provided on said light absorbing layer for reverse-biasing said photodiode.

7. A photodetector module according to claim 5, wherein said photodetecting portion comprises a photodiode, and said photodetector further comprises a first electrode provided on said light absorbing layer so as to correspond to said photodetecting portion and a second electrode provided on said second main surface of said element substrate for reverse-biasing said photodiode.

8. A photodetector module according to claim 6, wherein said photodetector further comprises an n-type buffer layer laminated on said element substrate, and said light absorbing layer is etched in the vicinity of said photodetecting portion to partially expose said n-type buffer layer, said second electrode extending to a surface of said n-type buffer layer exposed.

9. A photodetector module according to claim 5, wherein said photodetector further comprises an n-type buffer layer laminated on said element substrate and a light reflecting layer having an opening allowing pass of said light beam to be received by said photodetecting portion.

10. A photodetector module according to claim 5, wherein said photodetector further comprises an n-type buffer layer formed on said element substrate and a semiconductor multilayer film formed on said n-type buffer layer, said semiconductor multilayer film having a wavelength selecting function.

11. A photodetector module according to claim 5, further comprising a dielectric multilayer film formed on said first inclined surface, said dielectric multilayer film having a wavelength selecting function.

12. A photodetector module according to claim 5, wherein said photodetector is joined to said support substrate by a soldering.

13. A photodetector module according to claim 5, wherein said photodetector is joined to said support substrate by a thermoplastic adhesive.

14. A photodetector module according to claim 5, wherein said support substrate has a projection, and said second end surface of said element substrate abuts against said projection of said support substrate to mount said photodetector on said support substrate.

15. A photodetector module comprising:

a support substrate having a main surface;

an optical waveguide mounted on said support substrate, said optical waveguide having an end face for emerging a light beam along a first optical path;

a photodetector mounted on said support substrate so that said light beam emerged from said end face of said optical waveguide is incident on said photodetector, said photodetector having a photodetecting portion responding to said light beam incident on said photodetector;

a first optical path converter converting said first optical path into a second optical path; and a second optical path converter converting said second optical path into a third optical path substantially perpendicular to said photodetecting portion, wherein said optical waveguide is formed on said support substrate so that said first optical path is parallel to said main surface of said support substrate, and said first and second optical path converters comprise first and second inclined surfaces formed on said photodetector obliquely to said main surface of said support substrate, respectively, said photodetector comprises an element substrate having first and second main surfaces opposed to each other and first and second end surfaces opposed to each other, a light absorbing layer formed on said first main surface of said element substrate and including said photodetecting portion, and a bump electrode formed on said light absorbing layer so as to correspond to said photodetecting portion, and said photodetector is provided on said support substrate in a condition that said first main surface of said element substrate is opposed to said main surface of said support substrate, that said bump electrode is connected to a conductor pattern formed on said support substrate, and that said first end surface of said element substrate is opposed to said end face of said optical waveguide.

16. A photodetector module according to claim 15, wherein said second end surface of said element substrate is substantially perpendicular to said support substrate, and said support substrate has a marker for positioning said second end surface of said element substrate.

17. A photodetector module according to claim 16, wherein said support substrate has a V-shaped groove extending in a longitudinal direction of said optical waveguide, and said end face of said optical waveguide abuts against said first end surface of said element substrate in a condition that a lower end portion of said optical waveguide is inserted in said V-shaped groove of said support substrate to mount said optical waveguide on said support substrate.

18. A photodetector module comprising:

a support substrate having a main surface;

an optical waveguide mounted on said support substrate, said optical waveguide having an end face for emerging a light beam along a first optical path;

a photodetector mounted on said support substrate so that said light beam emerged from said end face of said optical waveguide is incident on said photodetector, said photodetector having a photodetecting portion responding to said light beam incident on said photodetector;

a first optical path converter converting said first optical path into a second optical path; and a second optical path converter converting said second optical path into a third optical path substantially perpendicular to said photodetecting portion, wherein said photodetector comprises an element substrate having first and second main surfaces opposed to each other and first and second end surfaces opposed to each other, a light absorbing layer formed on said first main surface of said element substrate and including said photodetecting portion, and a lead electrode formed on said light absorbing layer so as to correspond to said photodetecting portion, said photodetector is mounted on said support substrate in a condition that said first end surface of said element substrate is joined to said main surface of said support substrate, and said first optical path converter comprises a first inclined surface formed so as to extend from said first end surface of said element substrate to said second main surface of said element substrate and intersect said light beam emerged from said end face of said optical waveguide along said first optical path, and said second optical path converter comprises a second inclined surface formed so as to be spaced from said first inclined surface and obliquely intersect said second main surface of said element substrate, for totally reflecting said light beam refracted by said first inclined surface toward said photodetecting portion.

19. A photodetector module according to claim 18, wherein said lead electrode comprises a first portion spaced from a surface of said light absorbing layer and extending along said light absorbing layer toward said support substrate, and a second portion formed continuously to said first portion and extending along said main surface of said support substrate, said second portion being connected to a wiring pattern formed on said main surface of said support substrate in a condition that said first end surface of said element substrate is joined to said main surface of said support substrate.

20. A photodetector module comprising:

a support substrate having a main surface;

an optical waveguide mounted on said support substrate, said optical waveguide having an end face for emerging a light beam along a first optical path;

a carrier mounted on said support substrate, said carrier having an inclined surface opposed to said end face of said optical waveguide and formed obliquely to said main surface of said support substrate, for refracting said light beam to convert said first optical path into a second optical path; and a photodetector mounted on said carrier so that said light beam propagated along said second optical path is incident on said photodetector, said photodetector having a photodetecting portion responding to said light beam incident on said photodetector, wherein said optical waveguide is mounted on said support substrate so that said first optical path is parallel to said main surface of said support substrate.

21. A photodetector module according to claim 20, further comprising an antireflection film formed on said inclined surface of said carrier.

22. A photodetector module comprising:

a support substrate having a main surface;

an optical waveguide mounted on said support substrate, said optical waveguide having an end face for emerging a light beam along a first optical path;

a carrier mounted on said support substrate, said carrier having an inclined surface formed obliquely to said main surface of said support substrate, for reflecting said light beam to convert said first optical path into a second optical path; and a photodetector mounted on said carrier so that said light beam propagated along said second optical path is incident on said photodetector, said photodetector having a photodetecting portion responding to said light beam incident on said photodetector, wherein said optical waveguide is mounted on said support substrate so that said first optical path is parallel to said main surface of said support substrate.

23. A photodetector module comprising:

a support substrate having a main surface;

an optical waveguide mounted on said support substrate, said optical waveguide having an end face for emerging a light beam along a first optical path;

a carrier mounted on said support substrate, said carrier having a first inclined surface opposed to said end face of said optical waveguide and formed obliquely to said main surface of said support substrate, for refracting said light beam to convert said first optical path into a second optical path, and a second inclined surface from which said light beam refracted by said first inclined surface is emerged; and a photodetector mounted on said second inclined surface of said carrier so that said light beam propagated along said second optical path is incident on said photodetector, said photodetector having a photodetecting portion responding to said light beam incident on said photodetector, wherein said optical waveguide is mounted on said support substrate so that said first optical path is parallel to said main surface of said support substrate.

24. A photodetector module according to claim 23, further comprising first and second antireflection films formed on said first and second inclined surfaces, respectively.

25. An apparatus comprising:

a substrate having a main surface; and a photodetector mounted on the substrate and having first, second and third surfaces, wherein the first surface is oblique with respect to the main surface and positioned so that a light beam traveling along a first optical path is incident on the first surface and thereby refracted from the first optical path to travel along a second optical path, the second surface is oblique with respect to the main surface and positioned so that the light beam traveling along the second optical path is incident on the second surface and thereby refracted by the second surface to travel along a third optical path, and the third surface is substantially perpendicular to the third optical path and is positioned so that the light beam traveling along the third optical path is incident on the third surface, the third surface being a photodetecting portion of the photodetector.

26. An apparatus as in claim 25, further comprising:

an optical waveguide mounted on the substrate and having an end face through which the light beam emerges to travel along the first optical path.

27. An apparatus as in claim 25, wherein the first optical path is parallel to the main surface.

28. An apparatus as in claim 26, wherein the first optical path is parallel to the main surface.

29. An apparatus comprising:

a substrate having a main surface;

an optical waveguide mounted on the substrate and having an end face through which a light beam emerges to travel along a first optical path; and a photodetector mounted on the substrate and having first, second and third surfaces, wherein the first surface is oblique with respect to the main surface and positioned so that the light beam traveling along the first optical path is incident on the first surface and thereby refracted from the first optical path to travel along a second optical path, the second surface is oblique with respect to the main surface and positioned so that the light beam traveling along the second optical path is incident on the second surface and thereby refracted by the second surface to travel along a third optical path, and the third surface is substantially perpendicular to the third optical path and is positioned so that the light beam traveling along the third optical path is incident on the third surface, the third surface being a photodetecting portion of the photodetector.

30. An apparatus as in claim 29, wherein the first optical path is parallel to the main surface.

* * * * *